US010778199B2

(12) United States Patent
Chen et al.

(10) Patent No.: US 10,778,199 B2
(45) Date of Patent: Sep. 15, 2020

(54) OSCILLATOR TEMPERATURE COMPENSATION TECHNIQUES

(71) Applicant: Analog Devices International Unlimited Company, Limerick (IE)

(72) Inventors: Yihui Chen, Shanghai (CN); Alex Xiao, Shanghai (CN); Wendy Mao, Shanghai (CN); Jie He, Shanghai (CN)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/197,184

(22) Filed: Nov. 20, 2018

(65) Prior Publication Data
US 2020/0162062 A1 May 21, 2020

(51) Int. Cl.
| H03K 3/02 | (2006.01) |
| H03K 4/502 | (2006.01) |
| H03K 3/0231 | (2006.01) |
| H03K 3/011 | (2006.01) |

(52) U.S. Cl.
CPC ............ H03K 4/502 (2013.01); H03K 3/011 (2013.01); H03K 3/0231 (2013.01)

(58) Field of Classification Search
CPC ....... H03K 4/502; H03K 3/011; H03K 3/0231
USPC .................................................. 331/111, 143
See application file for complete search history.

(56) References Cited

U.S. PATENT DOCUMENTS 7,847,648 B2  12/2010  Hu et al.
9,385,649 B2   7/2016  Wang et al.
2010/0090772 A1  4/2010  Hu et al.
2018/0145665 A1  5/2018  Hurwitz et al.

OTHER PUBLICATIONS

Gregoire, B. Robert, et al., "Process-Independent Resistor Temperature-Coefficients using Series/Parallel and Parallel/Series Composite Resistors", IEEE Int'l Symposium on Circuits and Systems (ISCAS), (2007), 4 pgs.
Paidimarri, Arun, et al., "An RC Oscillator With Comparator Offset Cancellation", IEEE Journal of Solid-State Circuits, vol. 51, No. 8, (Aug. 2016), 12 pgs.
Tokairin, Takashi, et al., "A 280nW, 100kHz, 1-Cycle Start-up Time, On-chip CMOS Relaxation Oscillator Employing a Feedforward Period Control Scheme", IEEE Symposium on VLSI Circuits Digest of Tech Papers, (2012), 2 pgs.
Wang, Jiacheng, et al., "A 12.77-MHz On-chip Relaxation Oscillator with Digital Compensation for Loop Delay Variation", IEEE Asian Solid-State Circuits Conference, (Nov. 2015), 4 pgs.

*Primary Examiner* — Richard Tan
(74) *Attorney, Agent, or Firm* — Schwegman Lundberg & Woessner, P.A.

(57) ABSTRACT

Techniques for compensating temperature-dependent aspects of oscillator circuits are provided. In an example, an oscillator circuit can include an oscillator capacitor, a comparator and overshoot compensation circuitry for providing an oscillation period insensitive to a temperature-dependent comparator overshoot. The oscillator capacitor can be charged during a charging portion of the oscillation period and can be discharged during a discharging portion of the oscillation period. The comparator can determine when the oscillator capacitor has been charged to a first threshold. The overshoot compensation circuitry can store an indication of temperature-dependent comparator overshoot and, in response, generate and apply an adjustable reference voltage or pre-charge to a terminal of the oscillator capacitor.

20 Claims, 9 Drawing Sheets

OSCILLATOR TEMPERATURE COMPENSATION TECHNIQUES

TECHNICAL FIELD OF THE DISCLOSURE

The present disclosure relates to oscillators, and more particularly, to techniques for compensating temperature-dependent aspects of oscillators.

BACKGROUND

Oscillators can use a variety of techniques to provide a periodic signal. One technique, which can also have a number of variations, is to cycle charge on a capacitor or series of capacitors and compare a level of the charge to trigger the transitions of the charge cycle. Oscillators employing this technique, or variations of it, are sometimes referred to as "relaxation oscillators," and their oscillation frequencies, or periods, can be influenced by, among other things, the comparator's delay and offset. Due to finite comparator delay, the capacitor's voltage can be charged to a reference voltage (VR1) plus some additional voltage ($\Delta V$), although the comparator's threshold is set to the reference voltage (VR1). Here, $\Delta V$ can be proportional to the comparator's delay. However, comparator delay can strongly vary with temperature. Thus, $\Delta V$ represents a temperature-dependent overshoot that can vary significantly with temperature and can lead to temperature-dependent variations of the oscillation frequency.

OVERVIEW OF THE DISCLOSURE

Techniques for compensating temperature-dependent aspects of oscillator circuits are provided. In an example, an oscillator circuit can include an oscillator capacitor, a comparator and overshoot compensation circuitry for providing an oscillation period insensitive to a temperature-dependent comparator overshoot. The oscillator capacitor can be charged during a charging portion of the oscillation period and can be discharged during a discharging portion of the oscillation period. The comparator can determine when the oscillator capacitor has been charged to a first threshold. The overshoot compensation circuitry can store an indication of temperature-dependent comparator overshoot and, in response, generate and apply an adjustable pre-charge voltage to a terminal of the oscillator capacitor.

This overview is intended to provide information about the subject matter of the present patent application. It is not intended to provide an exclusive or exhaustive explanation of the present subject matter. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
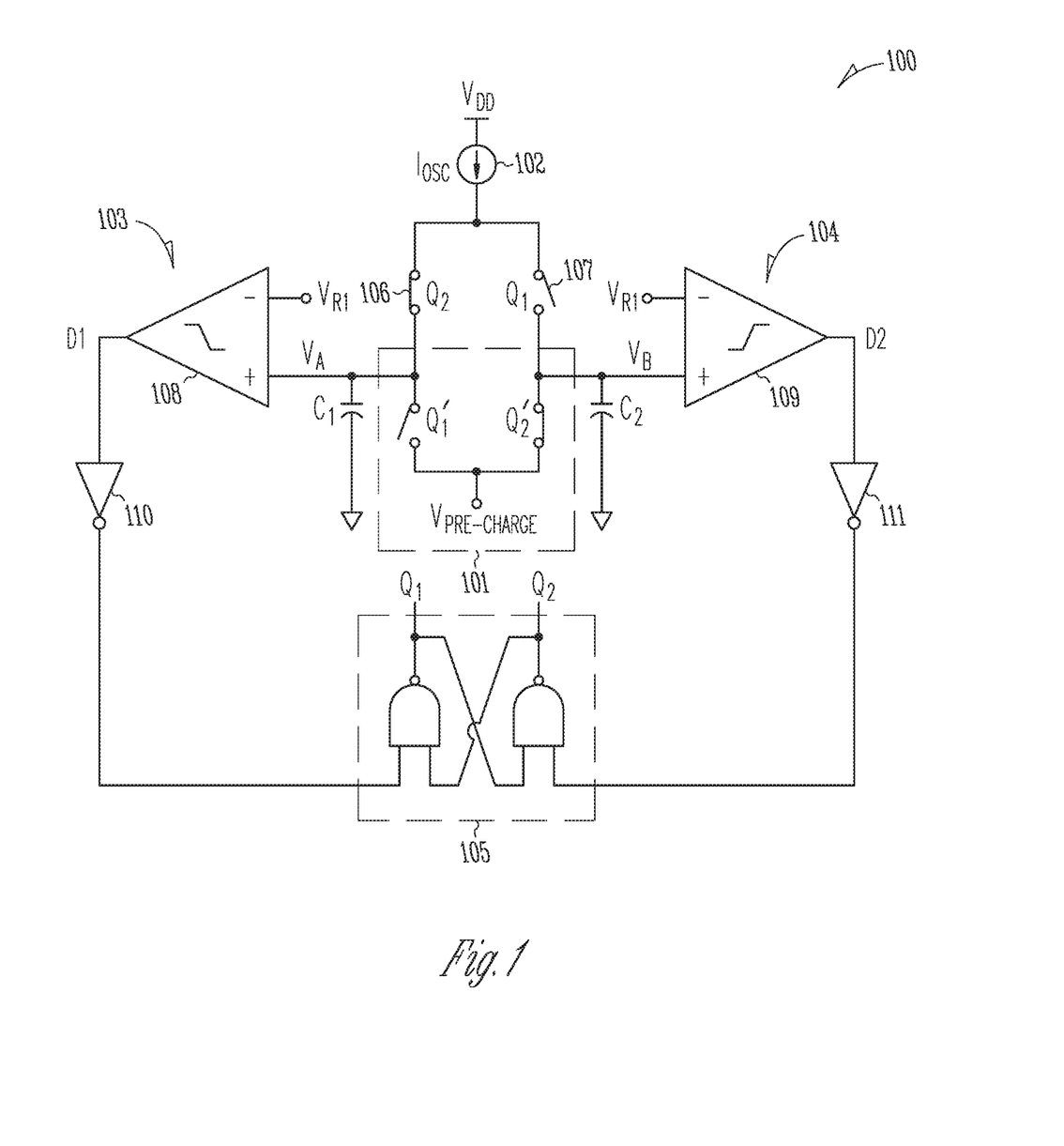
FIG. 1 illustrates generally a relaxation-type oscillator circuit with an example temperature compensation circuit.

FIG. 1 illustrates generally a relaxation-type oscillator circuit 100 with an example temperature compensation circuit 101. In an example, the oscillator circuit 100 can include a current source 102, first and second oscillator branch circuits 103, 104, a flip-flop 105, and the compensation circuit 101. Each branch circuit 103, 104 can include an enable switch 106, 107, a capacitor (C1, C2), a comparator 108, 109, and optional logic 110, 111 to provide a branch output to an input of the flip-flop 105. To illustrate basic operation of the oscillator circuit 100, assume the flip-flop 105 has just transitioned to a state with Q1=0 and Q2=1. With regards to the second or right-most branch circuit 104, the enable switch 107 is open (Q1=0) and a reset switch of the compensation circuit 101 is closed (Q2'=1). Thus, the capacitor (C2) of the second branch circuit 104 can be pre-charged and remain so until the enable switch 107 of the second branch circuit 104 closes.

With regards to the first or left-most branch circuit 103, the enable switch 106 can close (Q2=1) and the reset switch of the compensation circuit 101 can open (Q1=0), allowing the capacitor (C1) of the first branch circuit 103 to begin charging via current provided via the current source 102. The voltage across the capacitor can be compared to a threshold or reference voltage (VR1). As the voltage (VA) across the capacitor (C1) of the first branch circuit 103 exceeds the reference voltage (VR1), the output of the comparator 108 can change logic states. The change of logic states can trigger an input of the flip-flop 105, and the outputs (Q1, Q2) of the flip-flop 105 can "flip" and initiate a similar charging cycle of the capacitor (C2) of the second branch circuit 104, and so on. In certain examples, one or more outputs (D1, D2, Q1, Q2) of the comparators 108, 109 or the flip-flop 105 can be used as an output of the oscillator circuit 100 to provide one or more oscillator signals.

The temperature compensation circuit 101 can, as discussed in more detail below, provide a pre-charge function and can use representations (Q1', Q2') of the outputs (Q1, Q2) of the flip-flop 105 to detect, store, and pre-condition ($V_{PRE-CHARGE}$) the capacitors (C1, C2) of the oscillation circuit 101 so as to compensate for temperature dependent delays or offsets of, for example, the comparators 108, 109 or other components of the oscillation circuit 101.

Figure 2:
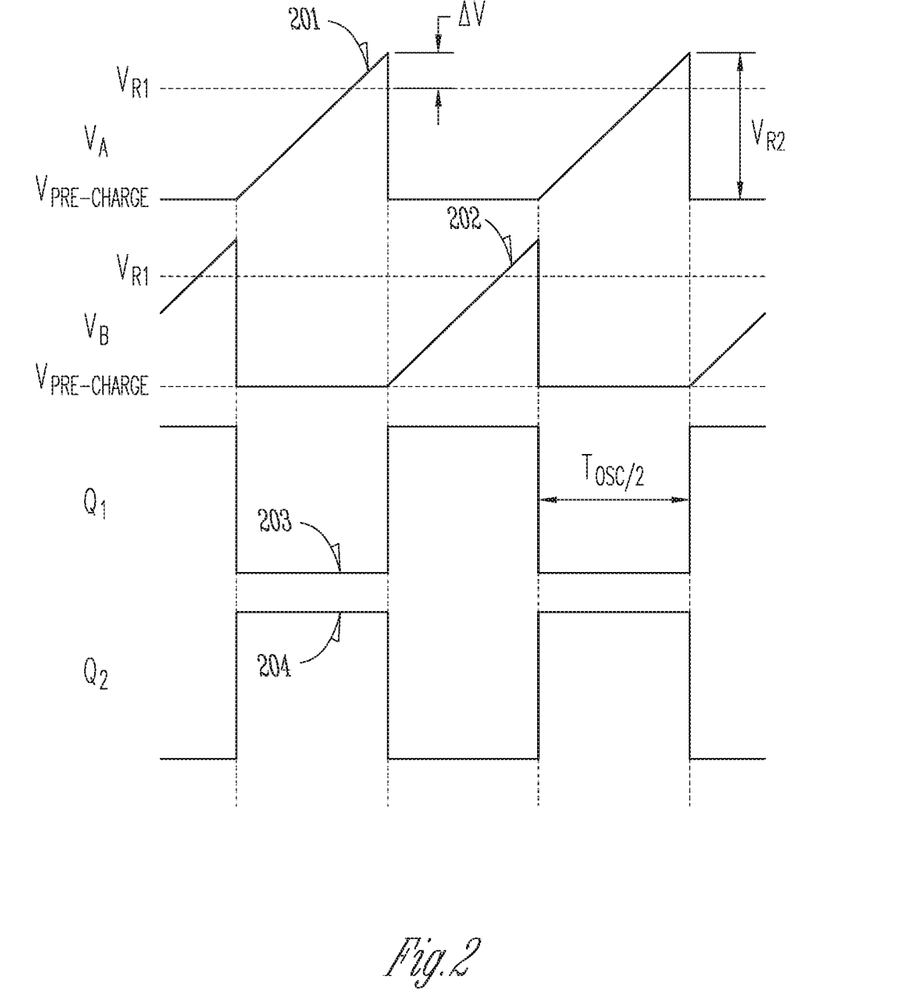
FIG. 2 provide a graphical illustration of various signals of the oscillator circuit of FIG. 1 during operation.

FIG. 2 provides a graphical illustration of various signals of the oscillator circuit 100 of FIG. 1 during operation. A first plot 201 illustrates the voltage (VA) across the capacitor (C1) of the first branch circuit 103. A second plot 202 illustrates the voltage (VB) across the capacitor (C2) of the second branch circuit 104. A third plot 203 illustrates the voltage at a first output (Q1) of the flip-flop 105. A fourth plot 204 illustrates the voltage at a second output (Q2) of the flip-flop 105. In conventional implementations of the oscillator circuit 100 of FIG. 1, the capacitors (C1, C2) of the first and second branch circuits 103, 104 are discharged to ground and begin its respective charging cycles from ground. As each capacitor is charged, during their respective charge cycle, the voltage across each capacitor can reach the reference voltage (VR1) and the output of the respective comparator (108, 109) can begin to transition.

The components of the oscillator are typically not ideal and some can contribute to an overall delay and an overall offset of the oscillator circuit. For example, each comparator (108, 109) can have a delay and an offset. The delay can be a measure of time that the comparator takes to change the state of the output of the comparator to reflect a change of state of the input voltages of the comparator. An offset of a comparator can reflect a voltage difference between the two input voltages when the comparator treats the voltages as equal. Delay and offset of a comparator can be strongly influenced by temperature, and if not compensated, can result in significant temperature-dependent variation of the oscillation frequency.

The present inventors have recognized that the effects of delay and offset can be measured using the voltage across one or more of the capacitors (C1, C2) of the branch circuits 103, 104 of the oscillator circuit 100. For example, referring to the first plot 201 and the second plot 202, if the discharged levels of the capacitor voltages are assumed to be ground, as would be true for a conventional implementation without compensation, the charged levels of the capacitors (C1, C2) will typically exceed the reference voltage (VR1) before the capacitors (C1, C2) begin to be discharged. The difference ($\Delta V$) between the reference voltage (VR1) and the voltage across the capacitor just before being discharged is a representation of the offset of the comparator, the delay of the comparator, and the delay of other components between the outputs of the comparators (103, 104) and the outputs of the flip-flop 105. The inventors have further recognized that a compensation circuit 101 can manipulate the pre-charge voltage ($V_{PRE\text{-}CHARGE}$) of each oscillator capacitor (C1, C2) of the oscillator circuit 100 and that such manipulation can remove the effects of the temperature dependent delay and offset from the transitions of the outputs of the flip-flop 105, thus, providing a more temperature-stable frequency of the oscillator circuit 100.

Figure 3:
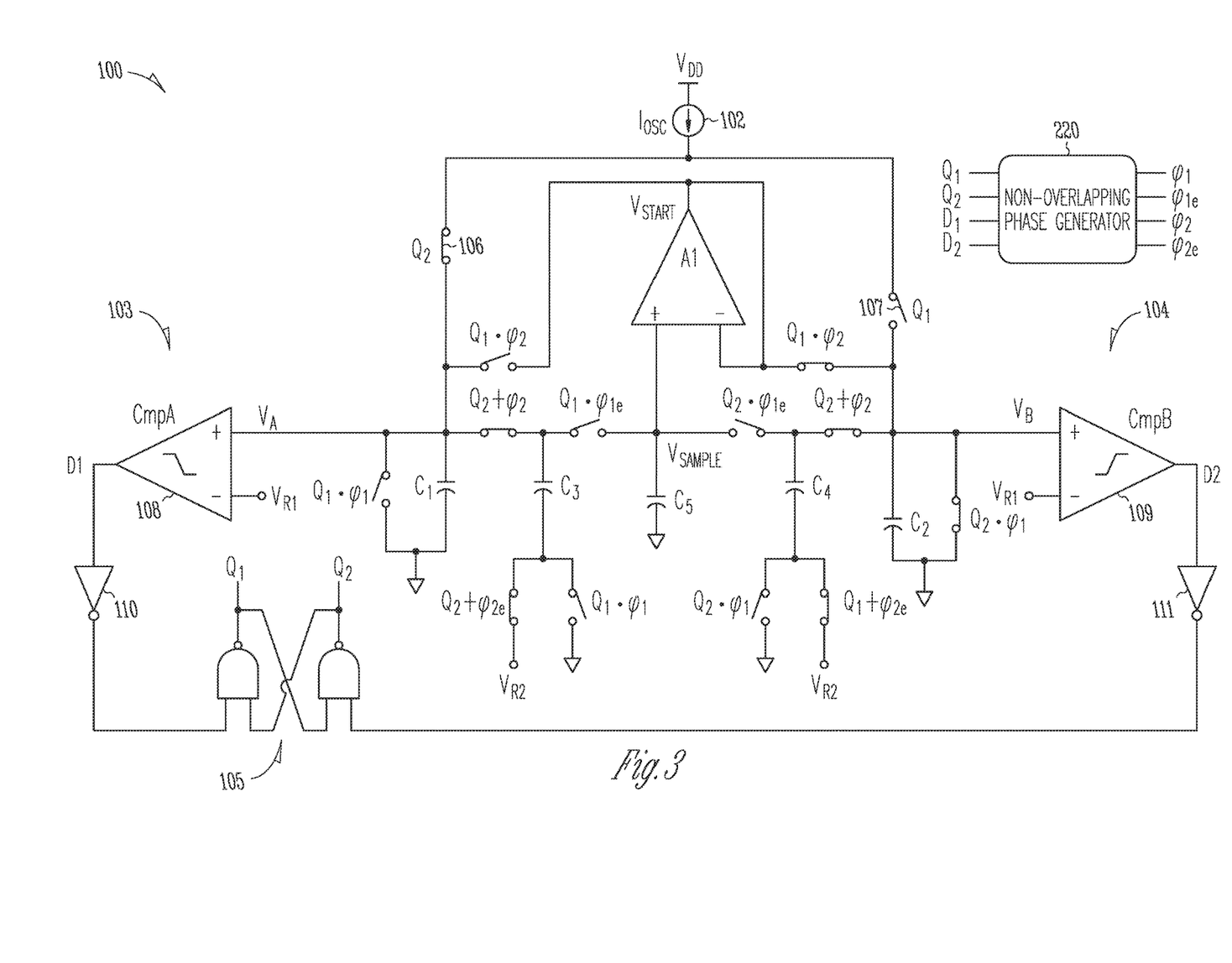
FIG. 3 illustrates generally an example oscillator circuit including a detailed representation of an example temperature compensation circuit.

FIG. 3 illustrates generally an example oscillator circuit 100 including a detailed representation of an example temperature compensation circuit 101. The compensation circuit 101 can include a phase generator 220, a number of switches responsive to outputs ($\varphi 1$, $\varphi 1e$, $\varphi 2$, $\varphi 2e$) of the phase generator 220 and several compensation capacitors (C3, C4, C5) to the oscillator circuit 100. In general, the phase generator 220 and the compensation capacitors (C3, C4, C5) can provide a measurement and memory circuitry to measure and store the delay and offset effect of each branch circuit 103, 104 and can then adjust a pre-charge voltage ($V_{PRE\text{-}CHARGE}$) of an oscillator capacitor (C1, C2) of the oscillator circuit 100 to compensate for the delay and offset effects. In some examples, upon first starting the oscillator circuit 100, compensation for the effects of delay and offset of the comparators 108, 109 of each branch circuit 103, 104 can be gradually realized over the first few cycles or periods of the oscillator circuit 100. FIGS. 4-8 illustrate the different components and phases or sub-states of the oscillator circuit 100 and the compensation circuit 101 of FIG. 3 in more detail.

Figure 4:
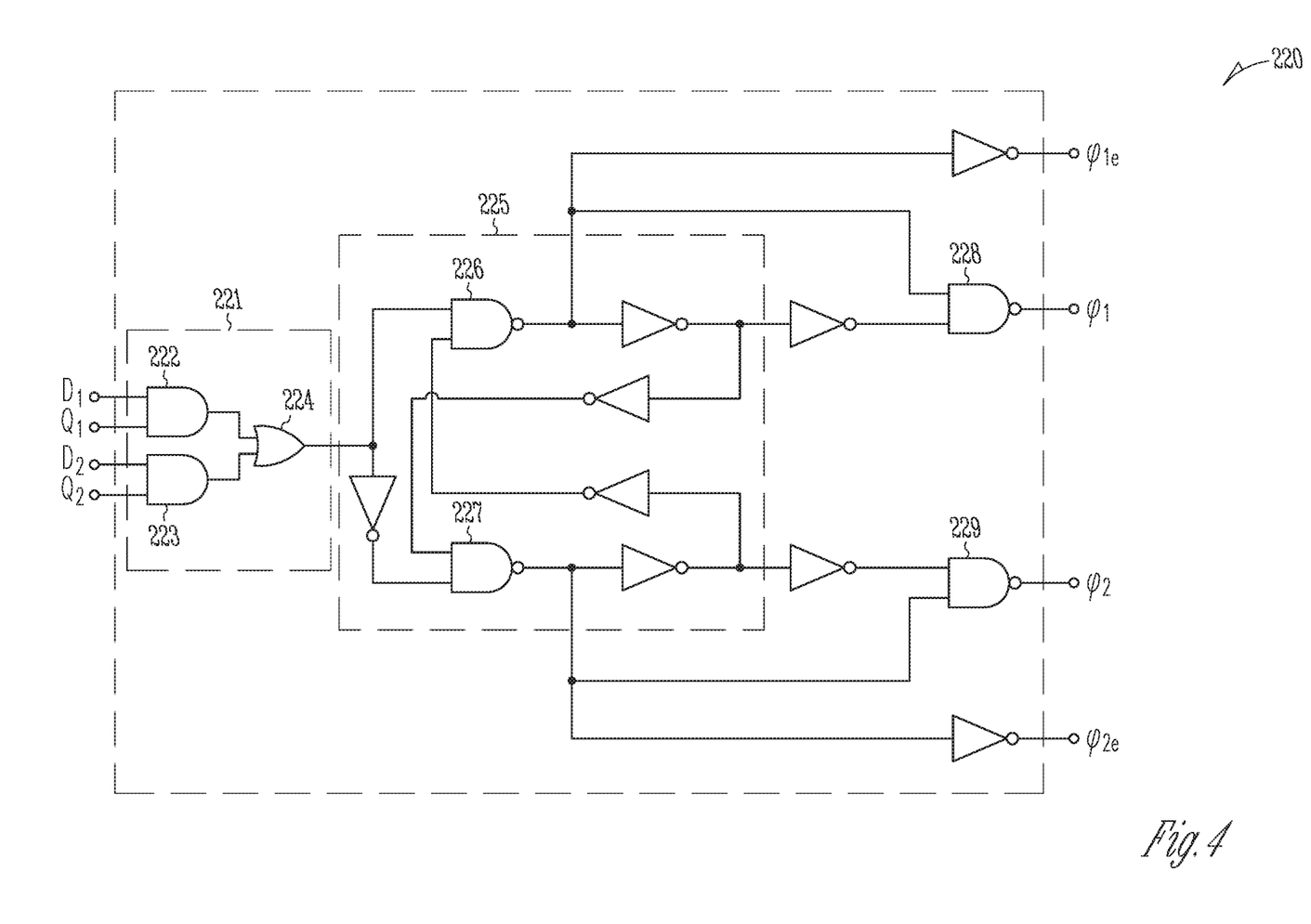
FIG. 4 illustrates an example phase generator for use in the example oscillator circuit of FIG. 3.

FIG. 4 illustrates an example phase generator 220 for use in the example oscillator circuit 100 of FIG. 3. In general, the phase generator 220 can receive the outputs (Q1, Q2) of the flip-flop 105 and the outputs (D1, D2) of the comparators 108, 109, and can generate signals that sequentially transition after each low-to-high transition or "flip" of the outputs (Q1, Q2) of the flip-flop 105. The sequential transitions of the flip-flop outputs (Q1, Q2) and the outputs ($\varphi 1$, $\varphi 1e$, $\varphi 2$, $\varphi 2e$) of the phase generator 220 can allow representations of delay and offset conditions of the oscillator circuit 100 to be stored and pre-charge voltage ($V_{PRE\text{-}CHARGE}$) of the oscillator capacitors (C1, C2) to be established each cycle such that the temperature-influenced delay and offset effects of the oscillator circuit 100 can be neutralized.

A first stage 221 of the phase generator 220 can control a trigger function of the phase generator 220. The first stage 221 can include two AND-gates 222, 223 and an OR-gate 224. A second stage 225 of the phase generator 220 can include cross-coupled NAND-gates 226, 227 and several inverters to form a flip-flop type circuit. Several additional inverters and two NAND-gates 228, 229 can condition signals of the second stage 225 for a desired logic level, provide a delay, or sequence state changes of one or more of the outputs ($\varphi 1$, $\varphi 2$) based on a state change of a corresponding output ($\varphi 1e$, $\varphi 2e$).

Figure 5:
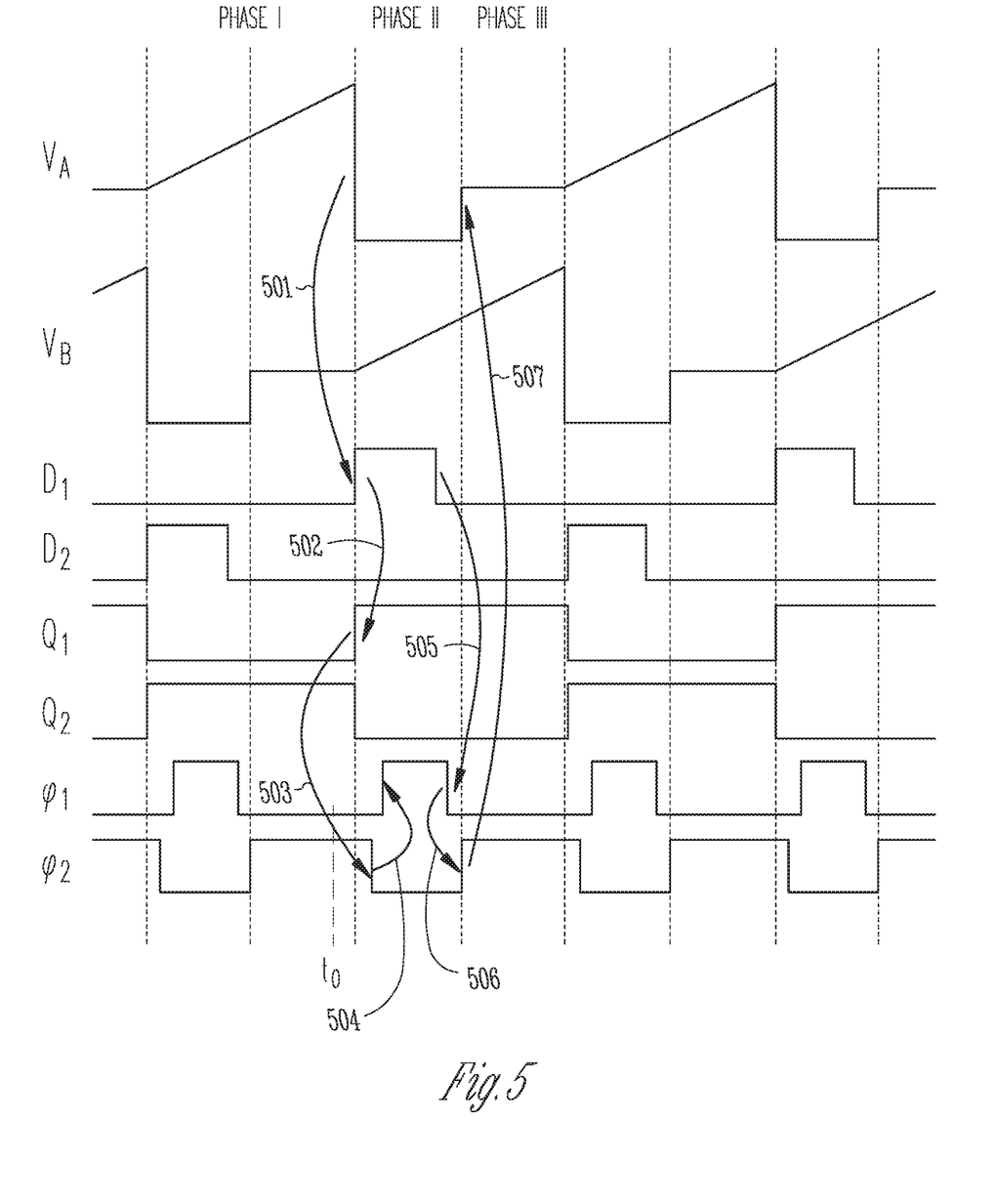
FIG. 5 illustrates the sequential transition of a first pair of the phase generator signals in relation to the charge voltage of each oscillator capacitor of the example oscillator circuit of FIG. 3, the output of each comparator of the example oscillator circuit, and the output signals of the flip-flop of the example oscillator circuit.

FIG. 5 illustrates the sequential transition of a first pair of the phase generator signals ($\varphi 1$, $\varphi 2$) in relation to the charge voltage (VA, VB) of each oscillator capacitor (C1, C2) of the example oscillator circuit 100 of FIG. 3, the output (D1, D2) of each comparator 108, 109 of the example oscillator circuit 100, and the output signals (Q1, Q2) of the flip-flop 105 of the example oscillator circuit 100. Each signal of the second pair of phase generator output signals ($\varphi 1e$, $\varphi 2e$) can be a copy of the corresponding signal of the first pair ($\varphi 1$, $\varphi 2$) and generally have falling edge transitions that precede falling edge transitions of the corresponding signal of the first pair ($\varphi 1$, $\varphi 2$) by a phase delay interval. In general, as the outputs (Q1, Q2) of the flip-flop 105 "flip," the phase generator flips the $\varphi 1x$ and $\varphi 2x$ outputs in a non-overlapping fashion. For example, in the illustrated example, just prior to the outputs (Q1, Q2) of the flip-flop "flipping", $\varphi 1x=0$ and $\varphi 2x=1$. After a first delay, after the flip-flop outputs "flip," the $\varphi 2x$ outputs (e.g., $\varphi 2$, $\varphi 2e$) go "low" 503 (e.g., $\varphi 2x=0$). After a second delay after the $\varphi 2x$ outputs ($\varphi 2$, $\varphi 2e$) go "low," the $\varphi 1x$ outputs ($\varphi 1$, $\varphi 1e$) go "high" 504 (e.g., $\varphi 1x=1$). The "flip" of the flip-flop outputs (Q1, Q2) can be associated with one of the oscillator capacitors (C1, C2) charging to the first reference voltage (VR1) 501 and the output (D1, D2) of the respective comparator 108, 109 transitioning from "low" to "high", (e.g., Dn=0→1) 502. After a third delay after the "flip," the respective oscillator capacitor (C1, C2) can be discharged and the output (Dn) of the respective comparator (108, 109) can transition back to "low," (e.g., Dn=1→0). After a fourth delay after the respective output (Dn) of the respective comparator (108, 109) transitions back to "low," (e.g., Dn=1→0), the $\varphi 1x$ outputs ($\varphi 1$, $\varphi 1e$) can transition back to "low" 505, (e.g., $\varphi 1x=1\rightarrow 0$). After a fifth delay after the $\varphi 1x$ outputs ($\varphi 1$, $\varphi 1e$) transition back to "low," the $\varphi 2x$ outputs ($\varphi 2$, $\varphi 2e$) can transition back to "high" 506, (e.g., $\varphi 2x=0\rightarrow 1$). In certain examples, in response to the $\varphi 2x$ outputs ($\varphi 2$, $\varphi 2e$) transitioning back to "high," the corresponding capacitor (C1, C2) can be pre-charged to compensate for temperature 507. The phase generator 220 is then ready to process the next "flip" of the flip-flop outputs (Q1, Q2).

Figure 6:
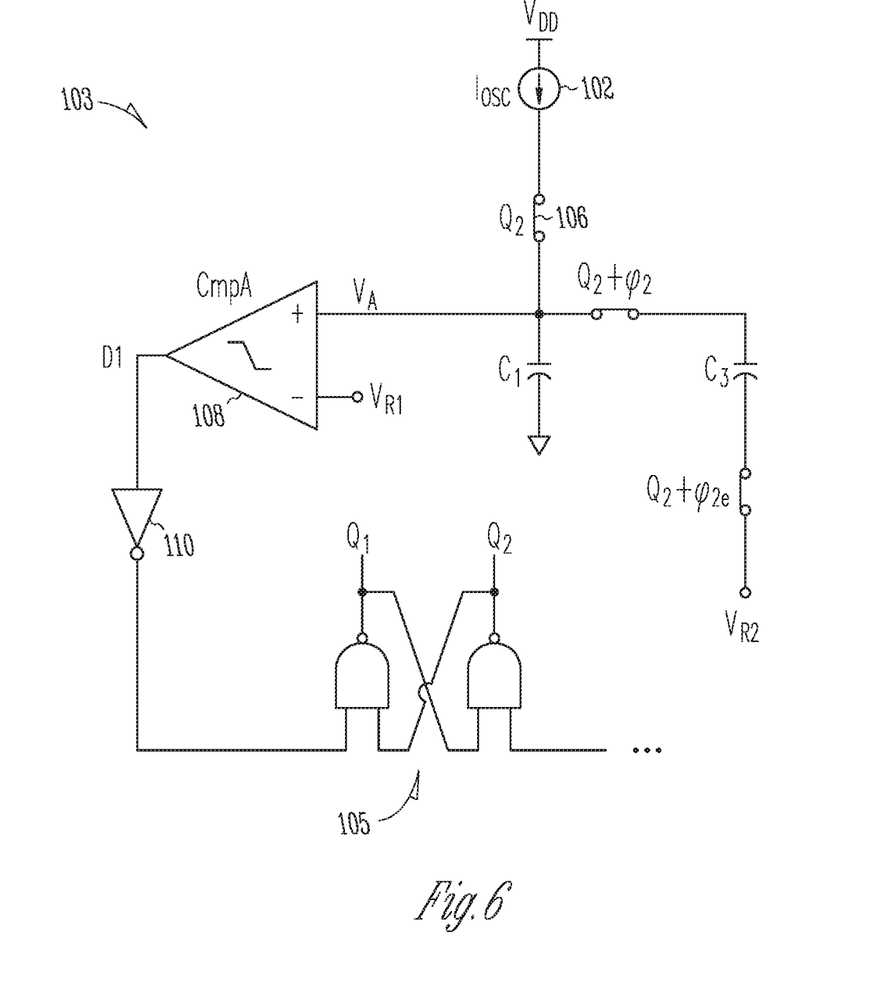
FIG. 6 illustrates a first phase of operation for a branch circuit.
Figure 7:
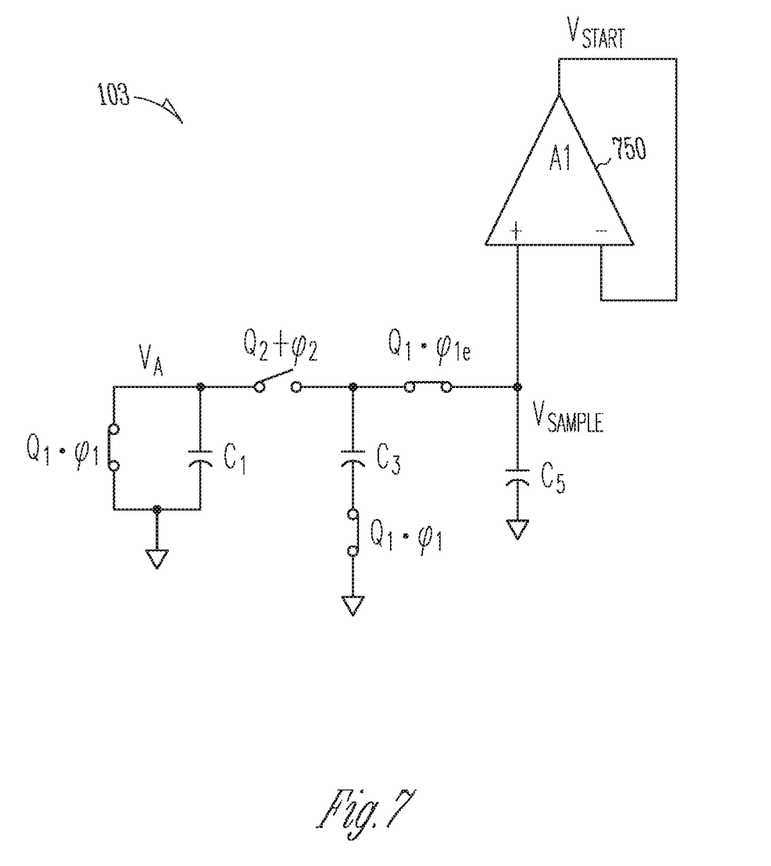
FIG. 7 illustrates a second phase of operation for the branch circuit.
Figure 8:
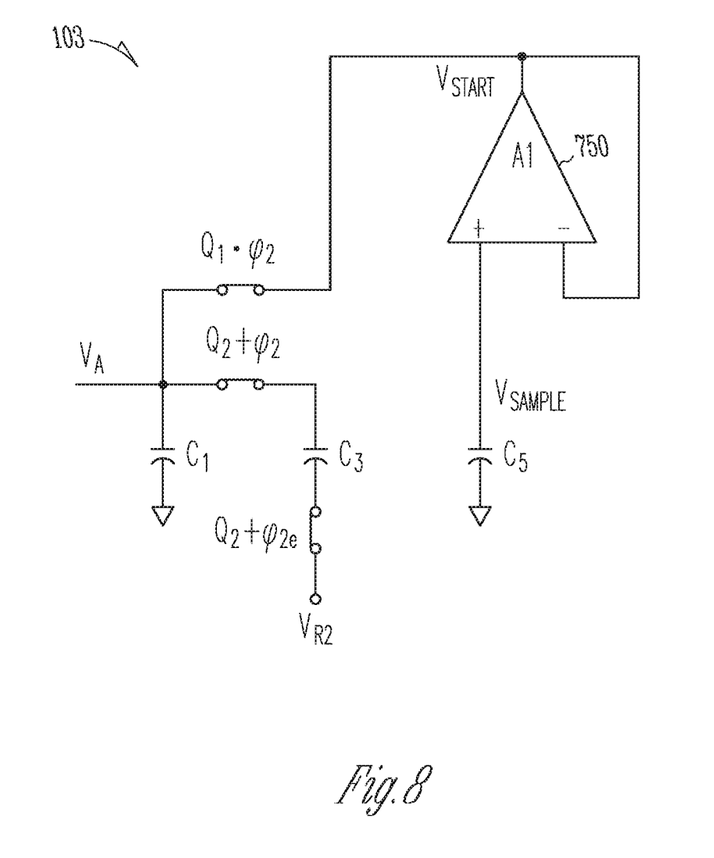
FIG. 8 illustrates a third phase of operation for the branch circuit.

Operation of the example oscillator circuit 100 of FIG. 3 can be explained by using a single branch circuit of the oscillator circuit 100 and breaking down the operation of that branch circuit into three phases. FIGS. 6-8 illustrate various overlapping portions of a first branch circuit 103 and components of the compensation circuit 101 of the example oscillator circuit 100 as each is configured to perform particular functions during one of the three phases. FIG. 6 illustrates a first phase of operation for the branch circuit 103. For the first phase, assume that Q1=0, Q2=1, and both Q2 and Q1 have been in such states for a long time relative to a half period (T/2) of the example oscillator circuit 100 such that $\varphi 1=0$, $\varphi 1e=0$, $\varphi 2=1$, and $\varphi 2e=1$. Thus, the charge current Iosc from the current source 102 can charge the oscillator capacitor (C1) of the first branch circuit 103 and a first compensation capacitor (C3) of the compensation circuit (e.g., FIG. 1, 101). The comparator 108 of the first branch circuit 103 can compare the voltage across the oscillator capacitor (C1) to a first reference voltage (VR1). Note that one plate, the bottom plate, of the first compensation capacitor (C3) is coupled to a second reference voltage (VR2). The voltage at a first node ($V_A$) can be sampled onto the first compensation capacitor (C3). As the voltage across the oscillator capacitor (C1) rises above the first reference voltage (VR1), the output (D1) of the comparator 108 can change from logic low (D1=0) to logic high (D1=1), and the operation of the compensation circuit can begin to transition from the first phase to a second phase.

Referring to FIGS. 6 and 7, during the transition to the second phase, the transition of D1 from "low" to "high" can cause the outputs (Q1, Q2) of the flip-flop 105 to "flip." In the illustrated example, Q1 can transition from "low" to "high" in response to D1 going "high." In addition, $\varphi 2$ can transition to "low" just before $\varphi 1$ transitions to "high." As a result, during the transition from the first phase to the second phase, first node ($V_A$) can be electrically isolated from the first compensation capacitor (C3), and the bottom plate of the first compensation capacitor (C3) can be electrically isolated from the second reference voltage (VR2).

Referring to FIG. 7, during the second phase, D1=1, Q1=1, Q2=0, $\varphi 2=\varphi 2e=0$, and $\varphi 1=\varphi 1e=1$. Thus, the bottom plate of the first compensation capacitor (C3) can be coupled to ground and the voltage on the first compensation capacitor (C3) can be sampled to a second compensation capacitor (C5). In certain examples, after a few oscillation periods, the sampled voltage ($V_{SAMPLE}$) on the second compensation capacitor (C5) can approach the charged voltage (VR1+$\Delta$V) of the first oscillator capacitor (C1) minus the second reference voltage (VR2) that was coupled to the first compensation capacitor (C3) during the charging cycle of the first oscillator capacitor (C1). An amplifier 750 configured as a voltage follower can buffer the voltage on the second compensation capacitor (C5)

Referring to FIG. 8 and using the phase generator signal graphic of FIG. 5, the third phase can see the $\varphi 1$ and $\varphi 1e$ signals transition from "high" to "low" and then the $\varphi 2$ and $\varphi 2e$ signals transition from "low" to "high," as D1 goes low, and Q1, and Q2 remain in the same states as in the second phase, (D1=0, Q1=1, Q2=0). As the $\varphi 1$ and $\varphi 1e$ signals transition to "low" in response to D1 going "low," the reset of the oscillator capacitor (C1) to ground can end, and the second compensation capacitor (C5) can be electrically isolated from the first compensation capacitor (C3).

As the $\varphi 2$ and $\varphi 2e$ signals transition to "high", the oscillator capacitor (C1) can be charged to the sampled voltage of the second compensation capacitor (C5), or more specifically VR1+$\Delta$V−VR2, via the output of the voltage follower amplifier 750. In addition, the first compensation capacitor (C3) can be referenced to the second reference voltage (VR2) and can be coupled to sample the voltage of the first oscillator capacitor (C1) during the subsequent charging cycle of the first branch circuit 103. For oscillator circuits with a second branch, and as can be observed via the timing diagram of FIG. 5 via the plot of the voltage of the second node (e.g., FIG. 1, $V_B$), the second and third phases described above can occur during the charge cycle of the second oscillator capacitor (C2) of the second branch circuit 104.

Figure 9:
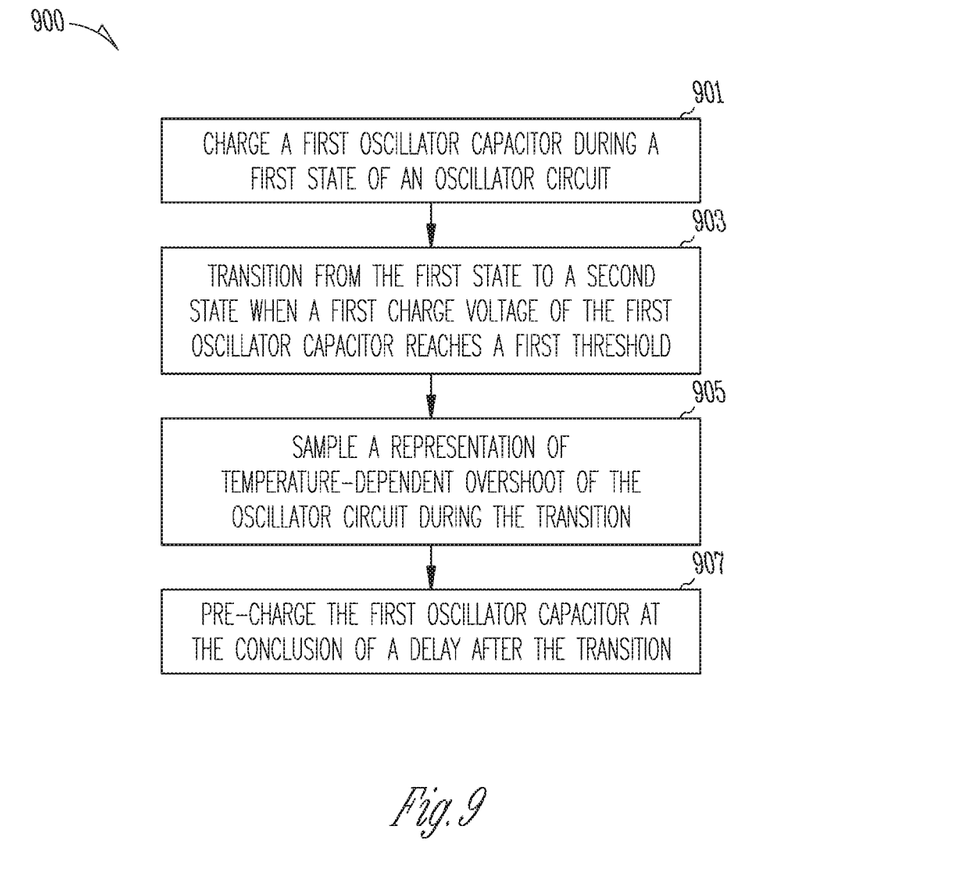
FIG. 9 illustrates generally a flowchart of an example method of operating an example temperature-compensated oscillator circuit.

FIG. 9 illustrates generally a flowchart of an example method 900 for compensating temperature-dependent variations of an oscillator circuit. At 901, a first oscillator capacitor can be charged during a first state of the oscillator circuit. At 903, the oscillator circuit can transition from the first state to a second state when the charge voltage of the first oscillator capacitor reaches a first threshold. In certain examples, the oscillator circuit can include a first sample capacitor than can be charged with the first oscillator capacitor. The first sample capacitor can be coupled to a reference while charging with the first oscillator capacitor. At 905, during the transition, a representation of a temperature dependent overshoot of the first threshold can be sampled and stored in a memory circuit, such as a second sample capacitor. In certain examples, the representation can be sampled by coupling the first sample capacitor to ground and sampling the voltage across the first sample capacitor to the second sample capacitor. At 907, the first oscillator capacitor can be pre-charged using the voltage across the second sample capacitor. In certain examples, the first oscillator capacitor can be pre-charged a delay interval after the transition from the first state to the second state.

In certain examples, the pre-charging can occur while a second oscillator capacitor of a second branch of the oscillator circuit is being charged. In certain examples, the voltage across the second sample capacitor can be buffered, and the output of the buffer can be used to pre-charge the first oscillator capacitor. In certain examples, a branch circuit including the second oscillator capacitor can sample and pre-charge the second oscillator capacitor while the first oscillator capacitor is being charged. In certain examples, the second branch can include a third sample capacitor analogous to the first sample capacitor. In certain examples, the second branch can include a second buffer. In certain examples, the second sample capacitor can be shared between the first branch of the oscillator circuit that includes the first oscillator capacitor and the first sample capacitor, and the second branch of the oscillator circuit.

Various Notes & Examples

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, the terms "including" and "comprising" are open-ended, that is, a system, device, article, composition, formulation, or process that includes elements in addition to those listed after such a term are still deemed to fall within the scope of subject matter discussed. Moreover, such as may appear in a claim, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of a claim. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. The following aspects are hereby incorporated into the Detailed Description as examples or embodiments, with each aspect standing on its own as a separate embodiment, and it is contemplated that such embodiments can be combined with each other in various combinations or permutations.

What is claimed is:

1. An oscillator circuit to provide an oscillation period insensitive to a temperature-dependent comparator overshoot, wherein the temperature-dependent comparator overshoot is indicative of a temperature-dependent delay or offset of the oscillator circuit, the oscillator circuit comprising:

a first oscillator capacitor arranged to charge during a charging portion of a first oscillation period and to discharge during a discharging portion of the first oscillation period;

a first comparator, coupled to the first oscillator capacitor, the first comparator configured to determine when the first oscillator capacitor has been charged to a first threshold, the first comparator subject to the temperature-dependent comparator overshoot; and overshoot compensation circuitry to generate and apply an adjustable reference voltage to a terminal of the first oscillator capacitor during a charging portion of a subsequent oscillation period in response to variations of temperature-dependent comparator overshoot, the overshoot compensation circuitry including memory circuitry to store an indication of the temperature-dependent comparator overshoot.

2. The oscillator circuit of claim 1, wherein the first comparator is configured to transition from a first state to a second state when the first oscillator capacitor charges to the first threshold.

3. The oscillator circuit of claim 2, wherein the overshoot compensation circuitry includes a first sample capacitor; and wherein, during a first sub-state of the second state, the first sample capacitor is configured to sample a charged voltage of the first oscillator capacitor, the first sample capacitor having a node coupled to a second threshold during the first sub-state.

4. The oscillator circuit of claim 3, wherein the memory circuitry includes a second sample capacitor; and wherein the overshoot compensation circuitry is configured to sample the charged voltage of the first sample capacitor to the second sample capacitor during a second sub-state of the second state, the node of the first sample capacitor coupled to ground during the second sub-state.

5. The oscillator circuit of claim 4, wherein the overshoot compensation circuitry includes a first voltage follower amplifier;

wherein, during a third sub-state of the second state, the second sample capacitor is coupled to an input of the first voltage follower amplifier; and wherein, during the third sub-state of the second state, the first oscillator capacitor is coupled to an output of the first voltage follower amplifier and is configured to receive a pre-charged voltage commensurate with a temperature compensation of the oscillator circuit.

6. The oscillator circuit of claim 5, including a phase generator configured to receive an indication of an output of the first comparator and to generate a plurality of phase signals configured to trigger the first, second, and third sub-states of the second state.

7. The oscillator circuit of claim 1, including a phase generator configured to receive a representation of an output of the first comparator and to provide outputs to trigger one or more sub-states of the oscillator circuit in response to a change of states of the representation.

8. The oscillator circuit of claim 1, including:

a first branch circuit including the first oscillator capacitor, and the first comparator;

a second branch circuit including:
  a second oscillator capacitor arranged to discharge during the charging portion of the oscillation period and to charge during the discharging portion of the oscillation period; and
  a second comparator, coupled to the second oscillator capacitor, the second comparator configured to determine when the second oscillator capacitor has been charged to a third threshold, the second comparator subject to the temperature-dependent comparator overshoot; and
  a flip-flop configured to receive a representation of an output of the first comparator and a representation of an output of the second comparator, and to provide complementary output signals of the oscillator circuit.

9. A method of compensating temperature-dependent overshoot of an oscillator circuit, the method comprising:
  charging a first oscillator capacitor during a first state of an oscillator cycle;
  transitioning from the first state to a second state of the oscillator cycle when a first charge voltage of the first oscillator capacitor reaches a first threshold to provide a first transition;
  sampling a representation of the temperature-dependent overshoot using the first charge voltage of the first oscillator capacitor during the first transition; and
  pre-charging the first oscillator capacitor at a conclusion of a first delay after the first transition.

10. The method of claim 9, wherein the charging a first oscillator capacitor includes selectively coupling a current source to the first oscillator capacitor in response to a state change of a flip-flop of the oscillator circuit.

11. The method of claim 9, including generating a plurality of phase signals in response to the first transition.

12. The method of claim 11, wherein sampling a representation of the temperature-dependent overshoot includes:
  selectively coupling a first node of a first sample capacitor to the first oscillator capacitor in response to a first state of a first phase signal of the plurality of phase signals; and
  selectively coupling a second node of the first sample capacitor to a second threshold in response to a first state of a second phase signal of the plurality of phase signals.

13. The method of claim 12, wherein sampling a representation of the temperature-dependent overshoot further includes:
  selectively coupling the first node of the first sample capacitor to a second sample capacitor in response to a first state of a third phase signal of the plurality of phase signals and a second state of the first phase signal; and
  selectively coupling the second node of the first sample capacitor to ground in response to a first state of a fourth phase signal of the plurality of phase signals and in response to a second state of the second phase signal.

14. The method of claim 13, wherein sampling a representation of the temperature-dependent overshoot further includes buffering a sampled voltage of the second sample capacitor to provide a buffered sample voltage.

15. The method of claim 14, wherein the pre-charging the first oscillator capacitor at the conclusion of a first delay after the first transition includes coupling the buffered sample voltage with the first oscillator capacitor in response to the first state of the first phase signal.

16. An apparatus for compensating temperature-dependent overshoot characteristics of an oscillator circuit, the apparatus comprising:
  means for charging a first oscillator capacitor during a first state of an oscillator cycle;
  means for transitioning from the first state to a second state of the oscillator cycle when a first charge voltage of the first oscillator capacitor reaches a first threshold to provide a first transition;
  means for sampling a representation of the temperature-dependent overshoot characteristics using the first charge voltage of the first oscillator capacitor during the first transition; and
  means for pre-charging the first oscillator capacitor at a conclusion of a first delay after the first transition.

17. The apparatus of claim 16, wherein the means for charging a first oscillator capacitor include means for selectively coupling a current source to the first oscillator capacitor in response to a state change of a flip-flop of the oscillator circuit.

18. The apparatus of claim 16, including means for providing a plurality of phase signals to control the means for charging, the means for transitioning, the means for sampling and the means for pre-charging.

19. The apparatus of claim 18, wherein the means for sampling a representation of the temperature-dependent overshoot characteristics includes:
  means for selectively coupling a first node of a first sample capacitor to the first oscillator capacitor in response to a first state of a first phase signal of the plurality of phase signals; and
  means for selectively coupling a second node of the first sample capacitor to a second threshold in response to a first state of a second phase signal of the plurality of phase signals.

20. The apparatus of claim 19, wherein the means for sampling a representation of the temperature-dependent overshoot characteristics further includes:
  means for selectively coupling the first node of a first sample capacitor to a second sample capacitor in response to a first state of a third phase signal of the plurality of phase signals and a second state of the first phase signal;
  means for selectively coupling the second node of the first sample capacitor to ground in response to a first state of a fourth phase signal of the plurality of phase signals and in response to a second state of the second phase signal;
  means for buffering a sampled voltage of the second sample capacitor to provide a buffered sample voltage; and
wherein the means for pre-charging the first oscillator capacitor at the conclusion of a first delay after the first transition includes means for coupling the buffered sample voltage with the first oscillator capacitor in response to the first state of the first phase signal.

* * * * *